US012463537B2

(12) United States Patent
Chen et al.

(10) Patent No.: US 12,463,537 B2
(45) Date of Patent: Nov. 4, 2025

(54) METHODS AND DEVICES FOR COMPACT VOLTAGE SUPPLY SWITCHING

(71) Applicant: Samsung Electronics Co., Ltd., Gyeonggi-do (KR)

(72) Inventors: Ying Chen, San Jose, CA (US); Tienyu Chang, Sunnyvale, CA (US); Xiaohua Yu, San Jose, CA (US)

(73) Assignee: Samsung Electronics Co., Ltd., Seoul (KR)

( * ) Notice: Subject to any disclaimer, the term of this patent is extended or adjusted under 35 U.S.C. 154(b) by 203 days.

(21) Appl. No.: 18/494,173

(22) Filed: Oct. 25, 2023

(65) Prior Publication Data
US 2025/0079982 A1 Mar. 6, 2025

Related U.S. Application Data

(60) Provisional application No. 63/580,766, filed on Sep. 6, 2023.

(51) Int. Cl.
| | |
|---|---|
| H02M 3/155 | (2006.01) |
| H02M 1/08 | (2006.01) |
| H03K 17/081 | (2006.01) |
| H03K 17/10 | (2006.01) |
| H03K 17/687 | (2006.01) |
| H03K 19/0175 | (2006.01) |
| H03K 19/20 | (2006.01) |

(52) U.S. Cl.
CPC ........... *H02M 3/155* (2013.01); *H02M 1/082* (2013.01); *H03K 17/08104* (2013.01); *H03K 17/102* (2013.01); *H03K 17/6871* (2013.01); *H03K 19/0175* (2013.01); *H03K 19/017509* (2013.01); *H03K 19/20* (2013.01); *H03K 2217/0081* (2013.01)

(58) Field of Classification Search
CPC ............................ H02M 3/155; H02M 1/082; H03K 17/08104; H03K 17/102; H03K 17/6871; H03K 19/0175; H03K 19/017509; H03K 19/20; H03K 2217/0081
See application file for complete search history.

(56) References Cited

U.S. PATENT DOCUMENTS

| | | | |
|---|---|---|---|
| 6,037,720 A * | 3/2000 | Wong | H03K 17/6871 327/236 |
| 6,449,669 B1 | 9/2002 | Dahlen et al. | |
| 6,456,511 B1 | 9/2002 | Wong | |
| 7,239,198 B1 * | 7/2007 | Drapkin | H03K 19/018528 327/563 |

(Continued)

*Primary Examiner* — Yusef A Ahmed
(74) *Attorney, Agent, or Firm* — The Farrell Law Firm, P.C.

(57) ABSTRACT

Methods and apparatuses are provided in which a level shifter of a digital control circuit for a switchable voltage supply circuit shifts a domain level of a first input. A first inverter of the digital control circuit inverts output of the first level shifter to output a first gain voltage to turn on a first switch of the switchable voltage supply circuit or output a second gain voltage to turn off the first switch. A second inverter of the digital control circuit inverts a second input to output a third gain voltage to turn on a second switch of the switchable voltage supply circuit or output a fourth gain voltage to turn off the second switch. The first gain voltage is greater than the third gain voltage.

20 Claims, 9 Drawing Sheets

(56) References Cited

U.S. PATENT DOCUMENTS

| | | | | |
|---|---|---|---|---|
| 7,598,715 | B1* | 10/2009 | Hariman | H02M 3/1588 |
| | | | | 323/222 |
| 10,122,349 | B1* | 11/2018 | Der | H03K 3/356182 |
| 10,483,977 | B1* | 11/2019 | Berwick | H03K 19/018521 |
| 10,587,262 | B1* | 3/2020 | Morini | H03K 17/04206 |
| 10,720,843 | B1 | 7/2020 | Wu et al. | |
| 2003/0006843 | A1* | 1/2003 | Tsunai | H03G 1/0088 |
| | | | | 330/284 |
| 2004/0095306 | A1* | 5/2004 | Fujiyoshi | G09G 3/3688 |
| | | | | 345/94 |
| 2010/0033014 | A1* | 2/2010 | Mueller | H02M 3/158 |
| | | | | 307/31 |
| 2010/0195358 | A1* | 8/2010 | Erbito, Jr. | G05F 1/56 |
| | | | | 363/84 |
| 2013/0200866 | A1* | 8/2013 | Kushibe | G05F 1/575 |
| | | | | 323/275 |
| 2014/0092285 | A1* | 4/2014 | Moriyama | H04N 25/779 |
| | | | | 348/297 |
| 2015/0189197 | A1* | 7/2015 | Guo | H04N 25/779 |
| | | | | 348/308 |
| 2015/0207495 | A1* | 7/2015 | Briere | H02M 7/538 |
| | | | | 327/109 |
| 2015/0222232 | A1* | 8/2015 | Takahashi | H03B 5/364 |
| | | | | 331/116 R |
| 2018/0017291 | A1* | 1/2018 | Neeb | B60H 1/00421 |
| 2018/0033815 | A1* | 2/2018 | Chalmers, Jr. | H03G 3/001 |
| 2018/0367106 | A1* | 12/2018 | Crols | H03F 3/195 |
| 2020/0118602 | A1* | 4/2020 | Yang | G11C 11/417 |
| 2021/0159891 | A1* | 5/2021 | Lee | H03K 3/356182 |
| 2021/0273559 | A1* | 9/2021 | Sandusky | H02M 3/07 |
| 2022/0173654 | A1* | 6/2022 | Giuliano | H02M 1/088 |
| 2022/0199124 | A1* | 6/2022 | Yang | G11C 5/147 |
| 2022/0385178 | A1* | 12/2022 | Routledge | H02M 1/0006 |
| 2022/0416653 | A1 | 12/2022 | Giuliano | |
| 2023/0009027 | A1* | 1/2023 | Chen | H03K 19/017509 |
| 2023/0010450 | A1* | 1/2023 | Balasubramanian | H02M 7/5387 |
| 2023/0038876 | A1* | 2/2023 | Jang | H03K 19/0016 |
| 2023/0083606 | A1* | 3/2023 | Li | H02M 3/158 |
| | | | | 323/282 |
| 2024/0106318 | A1* | 3/2024 | Kwak | H02M 1/08 |
| 2024/0313634 | A1* | 9/2024 | Routledge | H02M 1/0032 |
| 2024/0322681 | A1* | 9/2024 | Watanabe | H02M 1/008 |
| 2024/0419202 | A1* | 12/2024 | Sekita | G05F 1/468 |
| 2024/0421808 | A1* | 12/2024 | Lee | H03K 5/24 |

* cited by examiner

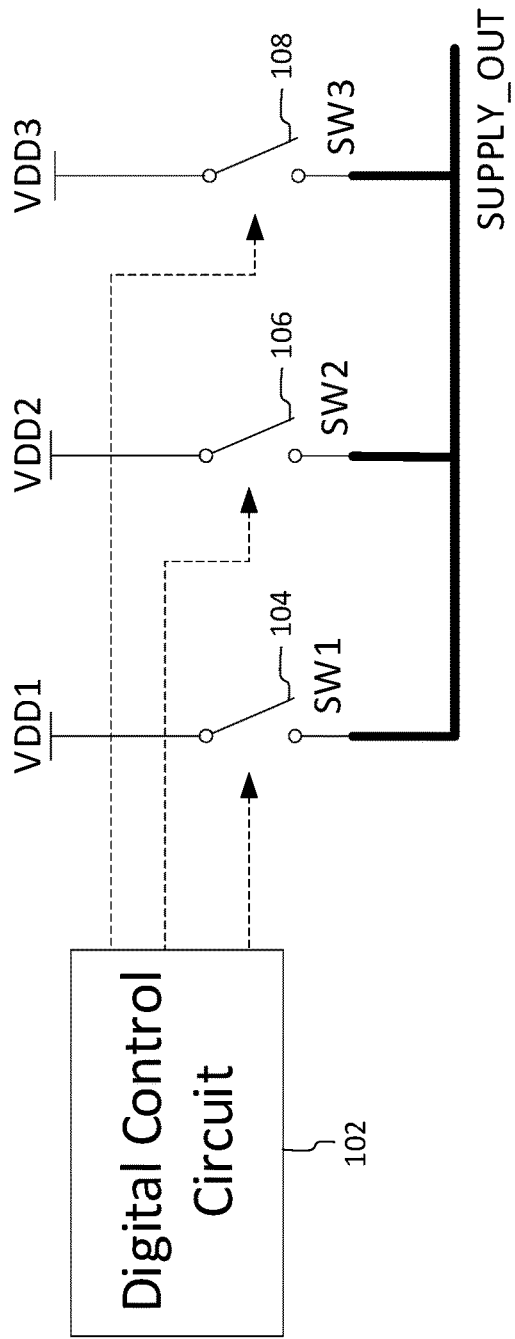
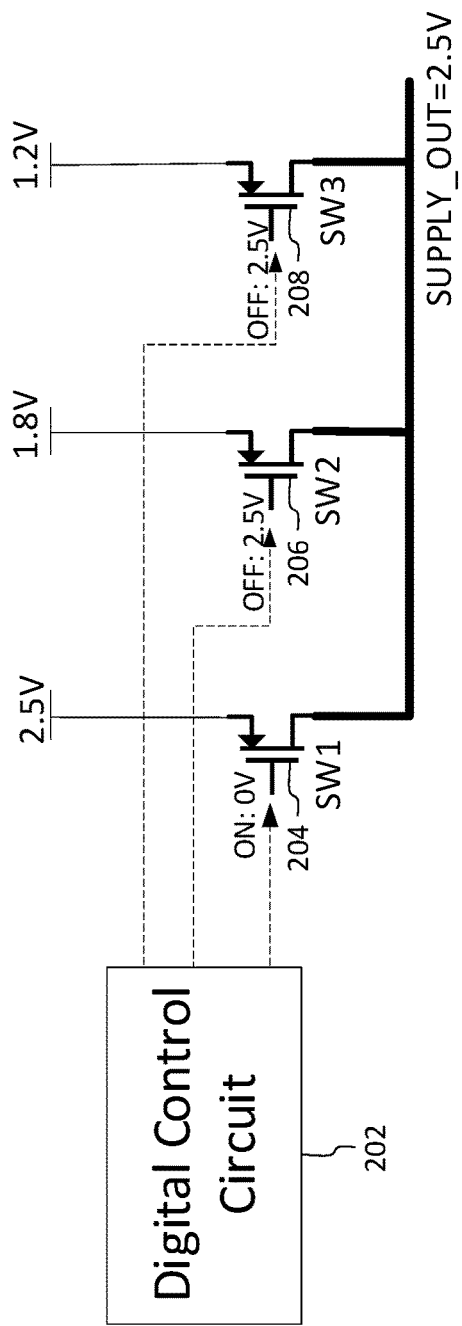
FIG. 1
FIG. 2A

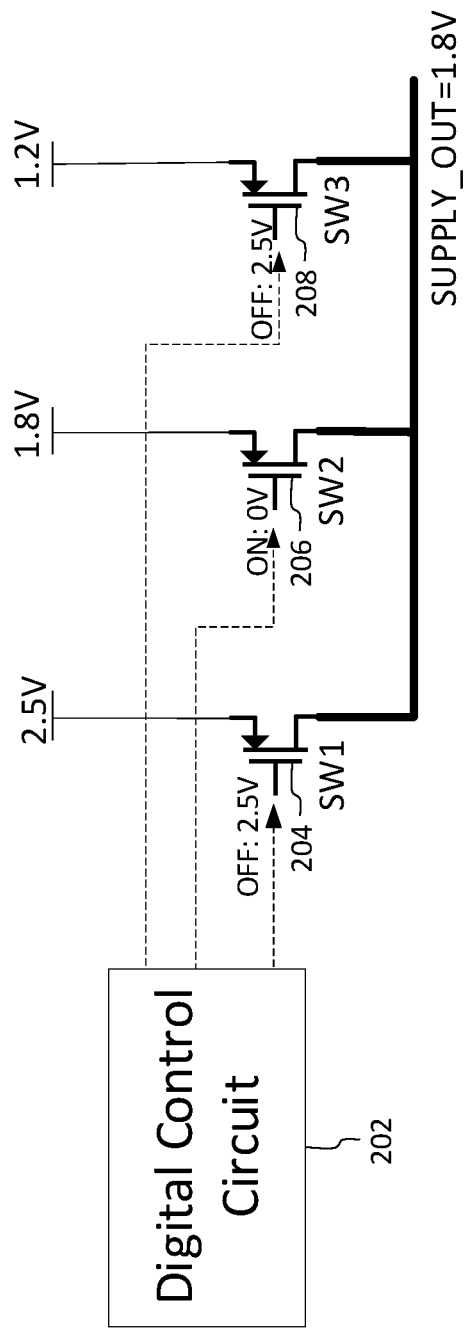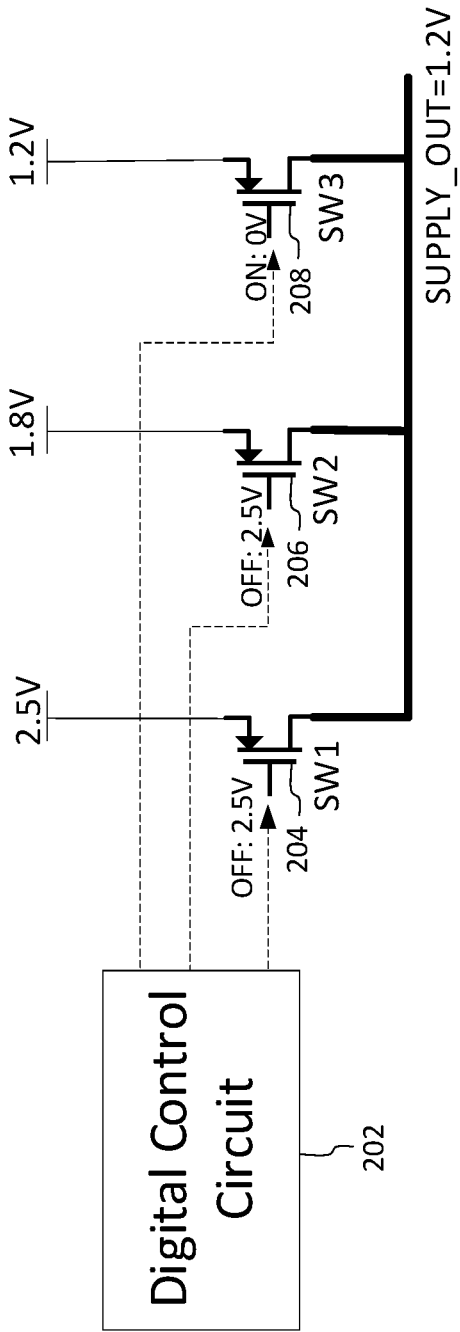
FIG. 2B
FIG. 2C

METHODS AND DEVICES FOR COMPACT VOLTAGE SUPPLY SWITCHING

CROSS-REFERENCE TO RELATED APPLICATION

This application claims the priority benefit under 35 U.S.C. § 119(e) of U.S. Provisional Application No. 63/580,766, filed on Sep. 6, 2023, the disclosure of which is incorporated by reference in its entirety as if fully set forth herein.

TECHNICAL FIELD

The disclosure generally relates to voltage supply switching. More particularly, the subject matter disclosed herein relates to improvements to digital control circuitry for voltage supply switching.

SUMMARY

Voltage supply switching may be used to change supply voltages of circuit blocks in order to achieve more optimal performance across different operating conditions. Voltage supply switching may be applied in a radio frequency (RF) power amplifier. A higher supply voltage at the RF power amplifier may be used to achieve higher maximum output powers, whereas a lower supply voltage at the RF power amplifier may assist in improving power efficiency during lower output power modes.

When large direct current (DC) currents are supplied to the RF power amplifier through voltage supply switches, significant IR voltage drop may occur across the voltage supply switches, and may result in performance degradations.

To solve this problem and minimize the IR voltage drop, an ON resistance ($R_{on}$) of the voltage supply switches may be minimized by increasing the device size of switch transistors. However, larger switch transistors occupy a larger amount of die area. In order to achieve a more compact die area, transistors having a lower threshold voltage ($V_{th}$) may be used for the voltage supply switches, since such transistors have a smaller device size for the same targeted value of $R_{on}$.

One issue with the above approach is that transistors with a lower $V_{th}$ may have lower breakdown voltages, limiting their application in higher supply voltage switching.

To overcome these issues, systems and methods are described in which a digital control circuit may provide lower switch-on voltages to voltage supply switches. Such an approach improves on previous methods because voltage supply switches using lower threshold voltage and lower breakdown voltage transistors may be used, which improve IR voltage drop and/or reduce die area of the voltage supply switch circuit.

In an embodiment, a digital control circuit of a switchable voltage supply circuit includes a first gain voltage path including a first level shifter and a first inverter. The first level shifter is configured to shift a voltage domain level of a first input. The first inverter is configured to invert output of the first level shifter, and output a first gain voltage to turn on a first switch of the switchable voltage supply circuit or output a second gain voltage to turn off the first switch. The digital control circuit also includes a second gain voltage path including a second inverter configured to receive a second input. The second inverter is configured to output a third gain voltage to turn on a second switch of the switchable voltage supply circuit or output a fourth gain voltage to turn off the second switch. The first inverter outputs the second gain voltage in case that the second inverter outputs the third gain voltage, the second inverter outputs the fourth gain voltage in case that the first inverter outputs the first gain voltage, and the first gain voltage is greater than the third gain voltage.

In an embodiment, a switchable voltage supply circuit includes voltage supply switches. Each of the voltage supply switches receives a different source voltage. The switchable voltage supply circuit also includes a digital control circuit that includes a first gain voltage path including a first level shifter and a first inverter. The first level shifter is configured to shift a voltage domain level of a first input. The first inverter is configured to invert output of the first level shifter, and output a first gain voltage to turn on a first switch of the voltage supply switches or output a second gain voltage to turn off the first switch. The digital control circuit also includes a second gain voltage path including a second inverter configured to receive a second input. The second inverter is configured to output a third gain voltage to turn on a second switch of the voltage supply switches or output a fourth gain voltage to turn off the second switch. The first inverter outputs the second gain voltage in case that the second inverter outputs the third gain voltage, the second inverter outputs the fourth gain voltage in case that the first inverter outputs the first gain voltage, and the first gain voltage is greater than the third gain voltage In an embodiment, a method includes shifting a voltage domain level of a first input at a level shifter of a digital control circuit for a switchable voltage supply circuit. A first inverter of the digital control circuit inverts output of the first level shifter to output a first gain voltage to turn on a first switch of the switchable voltage supply circuit or output a second gain voltage to turn off the first switch. A second inverter of the digital control circuit inverts a second input to output a third gain voltage to turn on a second switch of the switchable voltage supply circuit or output a fourth gain voltage to turn off the second switch. The first inverter outputs the second gain voltage in case that the second inverter outputs the third gain voltage, the second inverter outputs the fourth gain voltage in case that the first inverter outputs the first gain voltage, and the first gain voltage is greater than the third gain voltage.

BRIEF DESCRIPTION OF THE DRAWING

In the following section, the aspects of the subject matter disclosed herein will be described with reference to exemplary embodiments illustrated in the figures, in which:

FIG. 1 is a diagram illustrating a switchable voltage supply circuit, according to an embodiment;

FIGS. 2A-2C are diagrams illustrating a switchable voltage supply selecting 2.5 V, 1.8 V, or 1.2 V, according to an embodiment;

DETAILED DESCRIPTION

Figure 3:
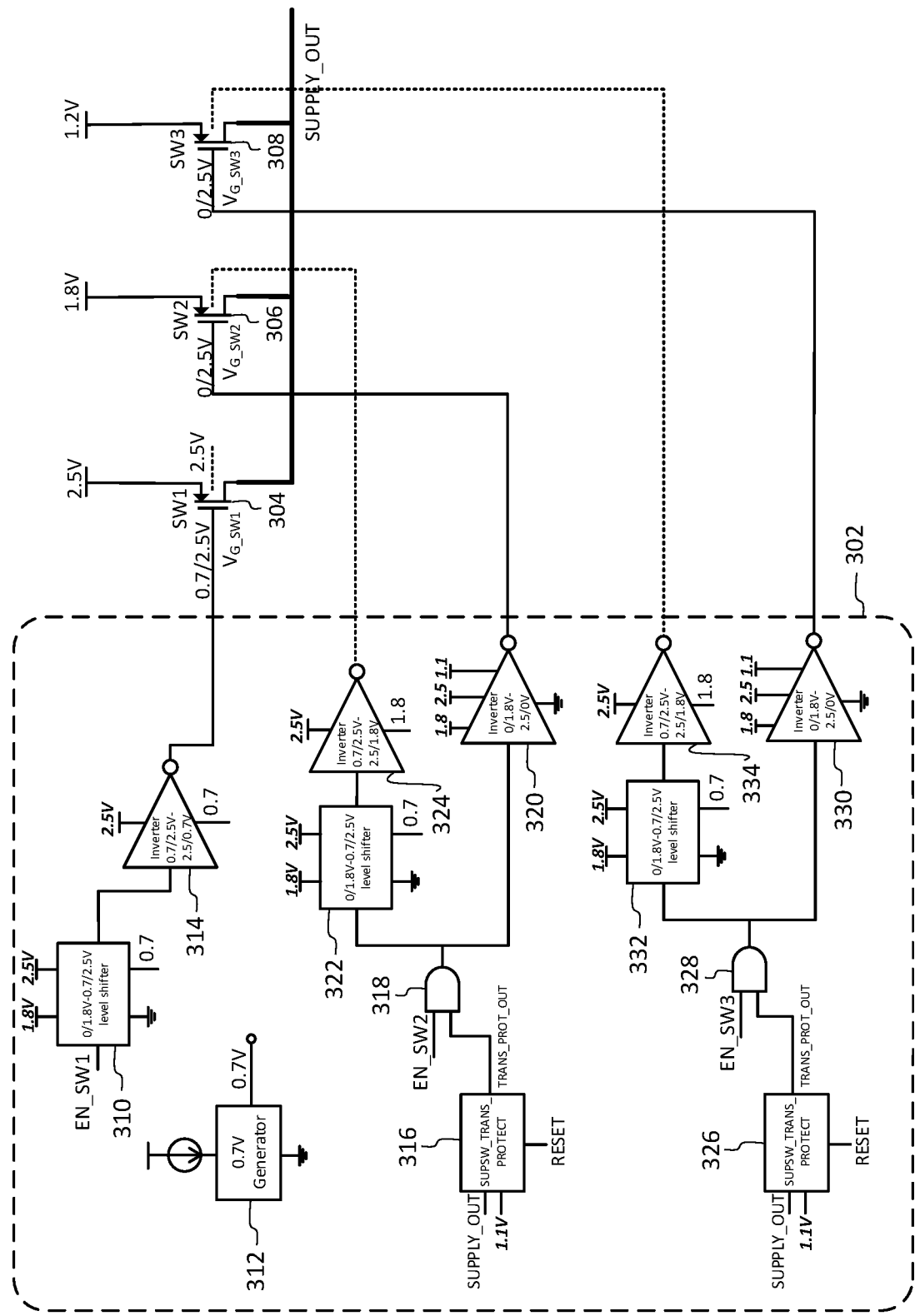
FIG. 3 is a diagram illustrating a switchable voltage supply and control logic circuits, according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

According to embodiments, a method is provided to reliably control voltage supply switches using lower threshold voltage and lower breakdown voltage transistors having lower switch-on resistances, thereby improving IR voltage drop and/or reducing die area of a voltage supply switch circuit. Undesired DC states for a level shifter in a digital control circuit may be avoided by adding large resistors between source nodes of p-channel metal oxide semiconductor (pMOS) transistors and a voltage supply. A circuit implementation may also be provided for switch transition protection when transitioning voltage modes using the voltage supply switches.

FIG. 1 is a diagram illustrating a switchable voltage supply circuit, according to an embodiment. A digital control circuit 102 may control voltage supply switches SW1 104, SW2 106, and SW3 108 in order to select one of the corresponding voltage drain supplies VDD1, VDD2, or VDD3 and connect to the output (SUPPLY_OUT) of the switchable voltage supply circuit. The digital control circuit 102 only switches on one of the voltage supply switches SW1 104, SW2 106, and SW3 108 at a time. While a switchable voltage supply circuit having three voltage supply switches is described herein, embodiments are not limited to a specific number of voltage supply switches, and a switchable voltage supply circuit may have two or more voltage supply switches.

FIGS. 2A-2C are diagrams illustrating a switchable voltage supply selecting 2.5 V, 1.8 V, or 1.2 V, according to an embodiment. The voltage supply switches may be implemented using pMOS transistors. In order to turn off a pMOS switch transistor, 2.5 V may be applied as the gate voltage. In order to turn on a pMOS switch transistor, 0 V may be applied as the gate voltage. While pMOS transistors are described herein, embodiments are not limited thereto, and any comparable transistors known in the art may also be used in the circuit. Additionally, embodiments are not limited to the specific voltages described herein that turn on and off the pMOS transistors, and other voltages may be utilized with other transistor types.

As shown in FIG. 2A, a digital control circuit 202 may apply 0 V to a first voltage supply switch SW1 204, turning on the first voltage supply switch SW1 204. The digital control circuit 202 may apply 2.5 V to a second voltage supply switch SW2 206 and to a third voltage supply switch SW3 208, turning off the second voltage supply switch SW2 206 and the third voltage supply switch SW3 208. This results in a SUPPLY_OUT of 2.5 V from the first voltage supply switch SW1 204. While voltage supplies of 2.5 V. 1.8 V, and 1.2 V are shown and described, embodiments are not limited to these voltage supplies.

As shown in FIG. 2B, the digital control circuit 202 may apply 0 V to the second voltage supply switch SW2 206, turning on the second voltage supply switch SW2 206. The digital control circuit 202 may apply 2.5 V to the first voltage supply switch SW1 204 and to the third voltage supply switch SW3 208, turning off the first voltage supply switch SW1 204 and the third voltage supply switch SW3 208. This results in a SUPPLY_OUT of 1.8 V from the second voltage supply switch SW2 206.

As shown in FIG. 2C, the digital control circuit 202 may apply 0 V to the third voltage supply switch SW3 208, turning on the third voltage supply switch SW3 208. The digital control circuit 202 may apply 2.5 V to the first voltage supply switch SW1 204 and to the second voltage supply switch SW2 206, turning off the first voltage supply switch SW1 204 and the second voltage supply switch SW2 206. This results in a SUPPLY_OUT of 1.2 V from the third voltage supply switch SW3 208.

A highest voltage stress occurs in the voltage supply configuration of FIG. 2A, in which both a source-to-gate voltage VSg and a drain-to-gate voltage Vag of a transistor of the first supply switch SW1 204 are at 2.5V. Accordingly, a pMOS transistor of the first voltage supply switch SW1 204 is required to have a breakdown voltage that is higher than 2.5V across drain/source and gate. High voltage breakdown transistors may have a higher Vih resulting in a larger transistor size for a certain $R_{on}$ target.

FIG. 3 is a diagram illustrating a switchable voltage supply and control logic circuits, according to an embodiment. The configuration of the control logic circuit enables switch transistors to have a 1.8 V breakdown voltage across gate-to-drain, gate-to-source, and gate-to-body.

A digital control circuit 302 may apply 0.7 V to turn on a first voltage supply switch SW1 304, and may apply 2.5 V to turn off the first voltage supply switch SW1 304. The digital control circuit 302 may apply 0 V to turn on a second voltage supply switch SW2 306, and may apply 2.5 V to turn off the second voltage supply switch SW2 306. The digital control circuit 302 may apply 0 V to turn on a third voltage supply switch SW3 308, and may apply 2.5 V to turn off the third voltage supply switch SW3 308.

Table 1 shows the gate voltage $V_G$, drain voltage $V_D$, source voltage $V_S$, and body/bulk voltage $V_B$ of the transistors of the first supply switch SW 304, the second supply switch SW 306, and the third supply switch SW 308, in a 2.5V mode.

TABLE 1

| 2.5 V Mode | $V_G$ (V) | $V_D$ (V) | $V_S$ (V) | $V_B$ (V) |
|---|---|---|---|---|
| SW1 (2.5 V) | 0.7 | 2.5 | 2.5 | 2.5 |
| SW2 (1.8 V) | 2.5 | 2.5 | 1.8 | 2.5 |
| SW3 (1.2 V) | 2.5 | 2.5 | 1.2 | 2.5 |

Table 2 shows the gate voltage $V_G$, drain voltage $V_D$, source voltage $V_S$, and body/bulk voltage $V_B$ of the transistors of the first supply switch SW 304, the second supply switch SW 306, and the third supply switch SW 308, in a 1.8V mode.

TABLE 2

| 1.8 V Mode | $V_G$ (V) | $V_D$ (V) | $V_S$ (V) | $V_B$ (V) |
|---|---|---|---|---|
| SW1 (2.5 V) | 2.5 | 1.8 | 2.5 | 2.5 |
| SW2 (1.8 V) | 0 | 1.8 | 1.8 | 1.8 |
| SW3 (1.2 V) | 2.5 | 1.8 | 1.2 | 2.5 |

Table 3 shows the gate voltage $V_G$, drain voltage $V_D$, source voltage $V_S$, and body/bulk voltage $V_B$ of the transistors of the first supply switch SW 304, the second supply switch SW 306, and the third supply switch SW 308, in a 1.2V mode.

TABLE 3

| 1.2 V Mode | $V_G$ (V) | $V_D$ (V) | $V_S$ (V) | $V_B$ (V) |
|---|---|---|---|---|
| SW1 (2.5 V) | 2.5 | 1.2 | 2.5 | 2.5 |
| SW2 (1.8 V) | 2.5 | 1.2 | 1.8 | 2.5 |
| SW3 (1.2 V) | 0 | 1.2 | 1.2 | 1.8 |

The voltages may be selected such that the switch transistors operate reliably without over-voltage stressing and while minimizing $R_{on}$ of the switches.

In order to provide a gate voltage $V_{G\_SW1}$ to the first voltage supply switch SW1 304, via a first gain voltage path, the digital control circuit 302 may include a first level shifter 310 and a first inverter 314. Specifically, an enable SW1 input (EN_SW1) is received at the first level shifter 310, along with 0.7 V from a 0.7 V generator 312. When the intention is to turn on the first voltage supply switch SW1 304, EN_SW1 may be set equal to 1, and 1.8 V may be provided. When the intention is to turn off the first voltage supply switch SW1 304, EN_SW1 may be set equal to 0, and 0 V may be provided. The voltage level may be shifted from a 0/1.8 V domain to a 0.7/2.5V domain at the first level shifter 310. The first level shifter 310 and the 0.7 generator 312 are described in greater detail below with reference to FIG. 5. Output from the first level shifter 310 (0.7 V or 2.5

V) and output from the 0.7 V generator 312 (0.7 V) may be provided to the first inverter 314, which may be embodied as a 0.7/2.5 V-to-2.5/0.7 V inverter. The first inverter 314 is described in greater detail below with reference to FIG. 4A.

When the first inverter 314 receives 2.5 V, the first inverter 314 may output 0.7 V as the $V_{G\_SW1}$ to turn on the first voltage supply switch SW1 304. When the first inverter 314 receives 0.7 V, the first inverter 314 may output 2.5 V as the $V_{G\_SW1}$ to turn off the first voltage supply switch SW1 304. A constant 2.5 V is applied as the bulk/body voltage $V_B$ to the first voltage supply switch SW1 304.

If $V_{G\_SW1}$ is 0.7 V, which turns on the first voltage supply switch SW1 304, $V_{G\_SW2}$ and $V_{G\_SW3}$ are 2.5 V, turning off the second and third voltage supply switches SW2 306 and SW3 308, resulting in a $V_D$ and SUPPLY_OUT of 2.5 V.

In order to provide a gate voltage $V_{G\_SW2}$ to the second voltage supply switch SW2 306, via a second gain voltage path, the digital control circuit 302 may include a first transition protection circuit 316, a first AND gate 318, and a second inverter 320. Specifically, an enable SW2 input (EN_SW2) may be received at the first AND gate 318. When the intention is to turn on the second voltage supply switch SW2 306, EN_SW2 may be set equal to 1, and when the intention is to turn off the second voltage supply switch SW2 306, EN_SW2 may be set equal to 0. The first transition protection circuit 316 may receive SUPPLY_OUT from the switchable voltage supply circuit, and may compare SUPPLY_OUT to 1.1 V. When SUPPLY_OUT is at or above 1.1 V, output from the first transition protection circuit 316 (TRANS_PROT_OUT) may be set to 0 and provided to the first AND gate 318. When SUPPLY_OUT falls below 1.1 V. TRANS_PROT_OUT may be set to 1 and provided to the first AND gate 318. The first transition protection circuit 316 is described in greater detail below with reference to FIG. 6.

When both EN_SW2 and TRANS_PROT_OUT are set to 1 at the AND gate 318, 1.8 V may be provided to the second inverter 320. Otherwise, 0 V may be provided to the second inverter 320. The second inverter 320 may be embodied as a 0/1.8 V-to-2.5/0 V inverter, and is described in greater detail below with reference to FIG. 4C. When the second inverter 320 receives 0 V, the second inverter 320 may output 2.5 V as the $V_{G\_SW2}$ to turn off the second voltage supply switch SW2 306. When the second inverter 320 receives 1.8 V, the second inverter 320 may output 0 V as the $V_{G\_SW2}$ to turn on the second voltage supply switch SW2 306.

If $V_{G\_SW2}$ is 0 V, which turns on the second voltage supply switch SW2 306, $V_{G\_SW1}$ and $V_{G\_SW3}$ are 2.5 V, turning off the first and third voltage supply switches SW1 304 and SW3 308, resulting in a $V_D$ and SUPPLY_OUT of 1.8 V.

The digital control circuit 302 may also include a second level shifter 322 and a third inverter 324 to provide a bulk/body voltage $V_B$ to the second voltage supply switch SW2 306, via a first bulk voltage path. Specifically, the output from the first AND gate 318 may be shifted from a 0/1.8 V domain to a 0.7/2.5 V domain at the second level shifter 322 using 0.7 V input from the 0.7 V generator 312. The second level shifter 322 and the 0.7 V generator 312 are described in greater detail below with reference to FIG. 5. Output from the second level shifter 322 (0.7 V or 2.5 V) is provided to the third inverter 324, which may be embodied as a 0.7/2.5V-to-2.5/1.8 V inverter and is described in greater detail below with reference to FIG. 4B. When the third inverter 324 receives 0.7 V, the third inverter 324 may output 2.5 V as the $V_B$ to the second voltage supply switch SW2 306 ($V_{G\_SW2}$=2.5). When the third inverter 324 receives 2.5 V, the third inverter 324 may output 1.8 V as the $V_B$ to the second supply switch SW2 306 ($V_{G\_SW2}$=0).

In order to provide a gate voltage $V_{G\_SW3}$ to the third voltage supply switch SW3 308, via a third gain voltage path, the digital control circuit 302 may include a second transition protection circuit 326, a second AND gate 328, and a fourth inverter 330. Specifically, an enable SW3 input (EN_SW3) may be received at the second AND gate 328. When the intention is to turn on the third voltage supply switch SW3 308, EN_SW3 may set equal to 1, and when the intention is to turn off the third voltage supply switch SW3 308, EN_SW3 may be set equal to 0. The second transition protection circuit 326 may receive SUPPLY_OUT from the switchable voltage supply circuit, and may compare SUPPLY_OUT to 1.1 V. When SUPPLY_OUT is at or above 1.1 V, output from the second transition protection circuit 326 (TRANS_PROT_OUT) may be set to 0 and provided to the second AND gate 328. When SUPPLY_OUT falls below 1.1 V, output from the second transition protection circuit 326 (TRANS_PROT_OUT) may be set to 1 and provided to the second AND gate 328. The second transition protection circuit 326 is described in greater detail below with respect to FIG. 6.

When both EN_SW2 and TRANS_PROT_OUT are set to 1 at the second AND gate 328, 1.8 V may be provided to the fourth inverter 330. Otherwise, 0 V may be provided to the fourth inverter 330. The fourth inverter 330 may be embodied as a 0/1.8 V-to-2.5/0 V inverter, and is described in greater detail below with reference to FIG. 4C. When the fourth inverter 330 receives 0 V, the fourth inverter 330 may output 2.5 V as the $V_{G\_SW3}$ to turn off the third voltage supply switch SW3 308. When the fourth inverter 330 receives 1.8 V, the fourth inverter 330 may output 0 V as the $V_{G\_SW3}$ to turn on the third voltage supply switch SW3 308.

If $V_{G\_SW3}$ is 0 V, which turns on the third voltage supply switch SW3 308, $V_G$ SW1 and $V_{G\_SW2}$ are 2.5 V, turning off the first and second voltage supply switches SW1 304 and SW2 306, resulting in a $V_D$ and SUPPLY_OUT of 1.2 V.

The digital control circuit 302 may also include a third level shifter 332 and a fifth inverter 334 to provide a bulk/body voltage $V_B$ to the third voltage supply switch SW3 308, via a second bulk voltage path. Specifically, the output from the second AND gate 328 may be shifted from a 0/1.8 V domain to a 0.7/2.5 V domain at the third level shifter 332, using 0.7 V input from the 0.7 V generator 312. The third level shifter 322 and the 0.7 V generator 312 are described in greater detail below with reference to FIG. 5. Output from the second level shifter 332 (0.7 V or 2.5 V) may be provided to the fifth inverter 334, which may be embodied as a 0.7/2.5-to-2.5/1.8 V inverter and is described in greater detail below with reference to FIG. 4B. When the fifth inverter 334 receives 0.7 V, the fifth inverter 334 may output 2.5 V as the $V_B$ to the third voltage supply switch SW3 308 ($V_{G\_SW3}$=2.5). When the fifth inverter 334 receives 2.5 V, the fifth inverter 334 may output 1.8 V as the $V_B$ to the third voltage supply switch SW3 308 ($V_{G\_SW3}$=0).

Figure 4A:
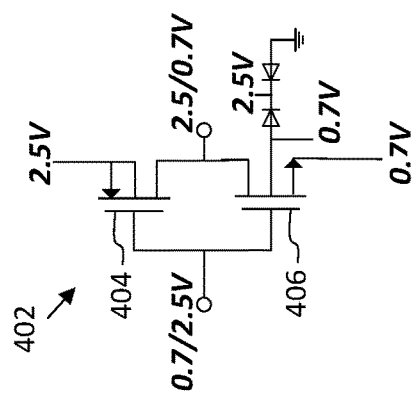
FIG. 4A is a diagram illustrating a 0.7/2.5 V-to-2.5/0.7 V inverter, according to an embodiment.

FIG. 4A is a diagram illustrating a 0.7/2.5 V-to-2.5/0.7 V inverter, according to an embodiment. Inverter 402 provides a detailed view of the first inverter 314 of FIG. 3. The inverter 402 may receive 0.7/2.5 V input logic and may output 2.5/0.7 V output logic, via first and second deep N-well transistors 404 and 406, which allow a higher voltage at a body node in order to ensure voltages across transistors are kept within breakdown limit. The inverter 402 may also receive 0.7 V from a 0.7 V generator.

Figure 4B:
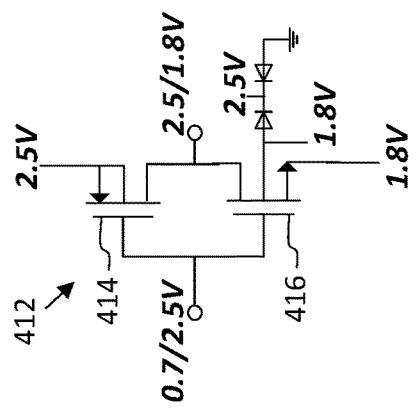
FIG. 4B is a diagram illustrating a 0.7/2.5 V-to-2.5/1.8 V inverter, according to an embodiment.

FIG. 4B is a diagram illustrating a 0.7/2.5 V-to-2.5/1.8 V inverter, according to an embodiment. Inverter 412 provides a detailed view of the third inverter 324 and the fifth inverter 334 of FIG. 3. The inverter 412 may receive 0.7/2.5 V input logic and may output 2.5/1.8 V output logic, via first and second deep N-well transistors 414 and 416, which allow a higher voltage at a body node in order to ensure voltages across transistors are kept within breakdown limit.

Figure 4C:
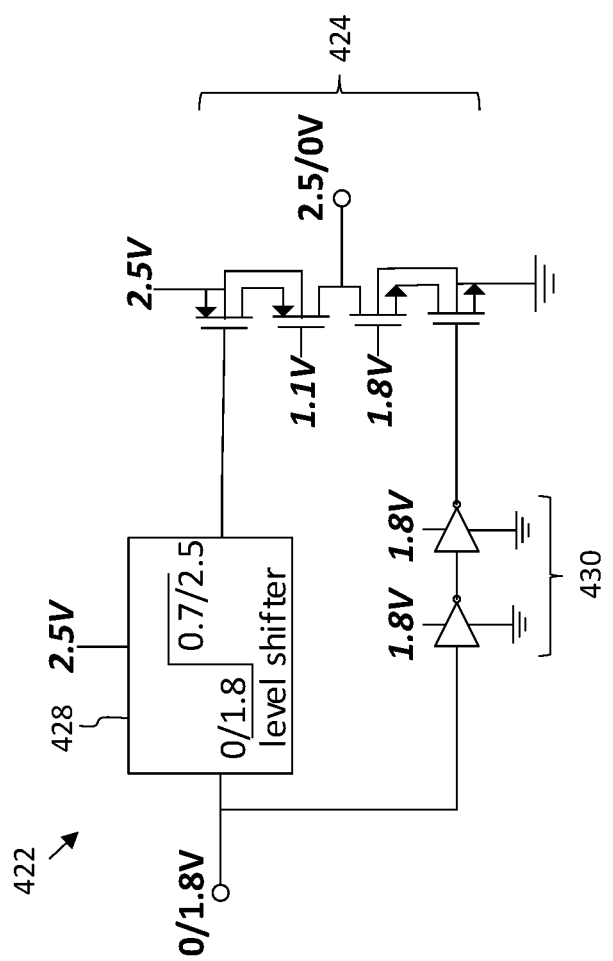
FIG. 4C is a diagram illustrating a 0/1.8 V-to-2.5/0 V inverter, according to an embodiment.

FIG. 4C is a diagram illustrating a 0/1.8 V-to-2.5/0 V inverter, according to an embodiment. Inverter 422 provides a detailed view of the second inverter 320 and the fourth inverter 330 of FIG. 3. The inverter 422 may receive 0/1.8 V input logic and may output 2.5/0 V output logic while all transistors are within a breakdown limit. The inverter 422 includes a fourth level shifter 428 on a first path and a pair of inverters 430 on a second path. The fourth level shifter 428 may shift a voltage level from a 0/1.8 V domain to a 0.7/2.5V domain. The inverter 422 includes four stacked (two pMOS, two nMOS) transistors 424 in order to ensure voltages across transistors are kept within breakdown limit. The inverter 422 may operate with 2.5 V supply and provide an output logic of 2.5/0 V. The pair of inverters 430 on the second path may provide the same delay time as that of the fourth level shifter 428, so that voltage control signals at the gates of the top pMOS transistor and the bottom nMOS transistor of the four stacked transistors 424 arrive at the same time.

Figure 5:
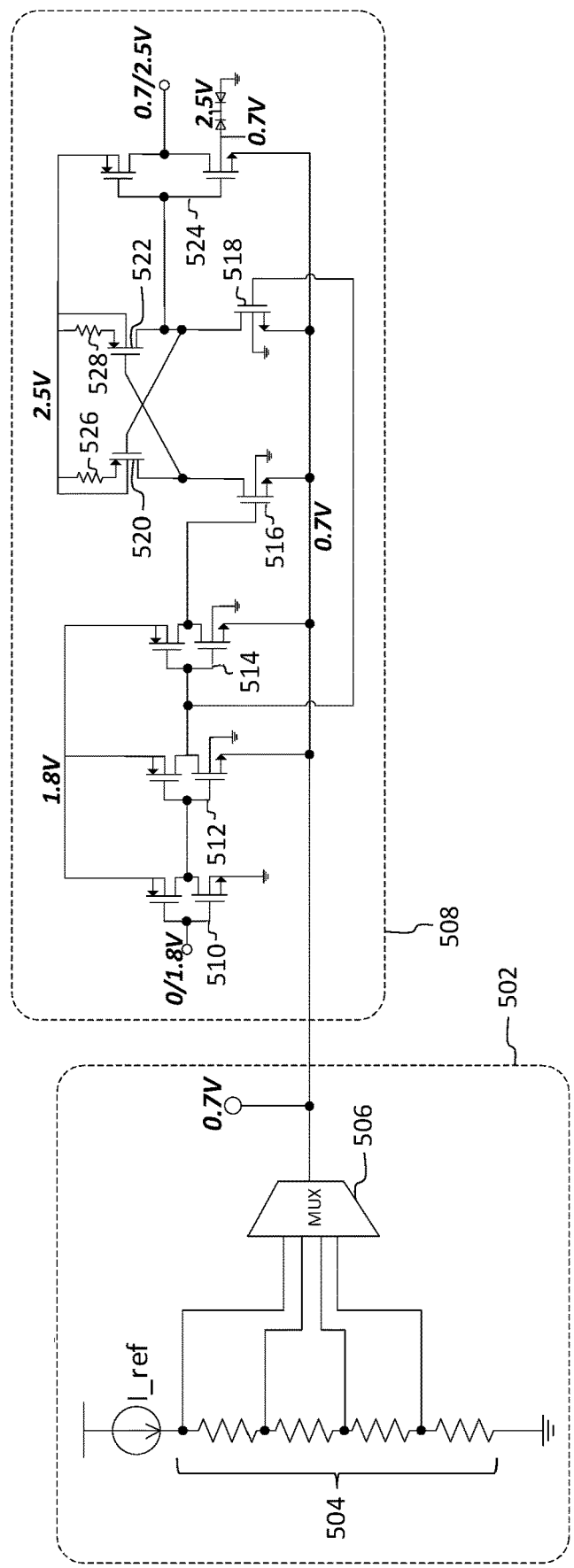
FIG. 5 is a diagram illustrating 0.7 V generator and a level shifter, according to an embodiment.

FIG. 5 is a diagram illustrating 0.7 V generator and a level shifter, according to an embodiment. A 0.7 V generator 502 provides a detailed view of the 0.7 V generator 312 of FIG. 3, and may include a resistor ladder 504 and a multiplexer (MUX) 506. The 0.7 V may be generated using a current source (I_ref) and the resistor ladder 504 and may be selected by the multiplexer 506. Large resistances may be used in the resistor ladder 504 in order to minimize the DC current (I_ref) from the current source. Therefore the output resistance from the 0.7 V generator 502 is high.

As shown in FIG. 5, a level shifter 508 provides a detailed view of first, second, and third level shifters 310, 322, and 332 of FIG. 3, and may shift DC logic levels from 0/1.8 V sent from digital core circuits to 0.7/2.5 V. The input 0/1.8 V logic may be inverted three times (e.g., at a 0/1.8 inverter 510 and two 0.7/1.8 inverters 512, 514) before entering into the latch circuits formed by a first nMOS transistor (MN1) 516, a second nMOS transistor (MN2) 518, a first pMOS transistor (MP1) 520, and a second pMOS transistor (MP2) 522. After the latch circuits, the logic may again be inverted by a 0.7/2.5 inverter 524 before output. However, due to DC leakage current flowing into the 0.7 V generator 502 that has a large output resistance, latch circuits formed by the first nMOS transistor (MN1) 516, the second nMOS transistor (MN2) 518, the first pMOS transistor (MP1) 520, and the second pMOS transistor (MP2) 522 may enter into an undesired DC state and cause operation failure. To avoid the undesired DC state, a first large resistor R1 526 and a second large resistor R2 528 may be disposed between source nodes of the first and second pMOS transistors 520 and 522 and a 2.5 V supply.

Figure 6:
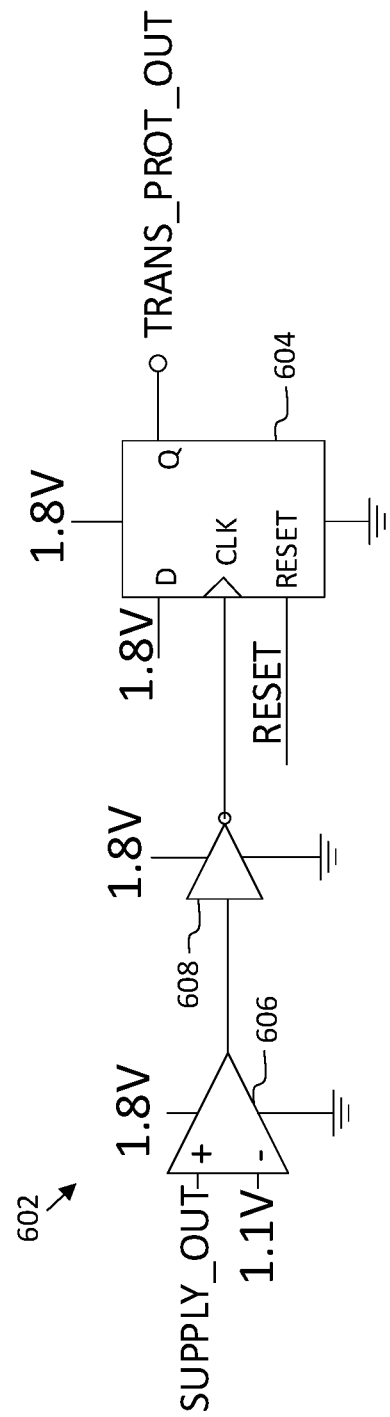
FIG. 6 is a diagram illustrating a transition protection circuit, according to an embodiment.

FIG. 6 is a diagram illustrating a transition protection circuit, according to an embodiment. A transition protection circuit 602 provides a detailed view of the first and second transition protection circuits 316 and 326 of FIG. 3. The transition from a 2.5 V mode in which the first voltage supply switch SW1 304 is turned on, to a 1.8 V mode in which the second voltage supply switch SW2 306 is turned on (or alternatively, 1.2 V mode in which the third voltage supply switch SW3 308 it turned on) may cause voltage stress to the gate-to-drain of the second supply voltage switch SW2 306 (or alternatively, the third voltage supply switch SW3 308) if the voltage of SUPPLY_OUT drops too slow. It may also cause voltage stress to the gate-to-drain of the first voltage supply switch SW1 304 if the voltage of SUPPLY_OUT drops faster than the second voltage supply switch SW2 306 (or alternatively, the third voltage supply switch SW3 308) turns on. The transition protection circuit 602 is provided to prevent voltage stressing during these transitions.

In order to transition from the 2.5 V mode to the 1.8 V mode (or alternatively, the 1.2 V mode), a delay (D) flip-flop 604 in the transition protection circuit 602 may be reset. EN_SW1 may be set to 0 and EN_SW2 may be set to 1 (or alternatively, EN_SW3 may be set to 1) at the same time. When the SUPPLY_OUT drops below 1.1 V, the second voltage supply switch SW2 306 (or alternatively, the third voltage supply switch SW3 308) may turn on and charge SUPPLY_OUT to 1.8 V (or alternatively, 1.2 V).

A comparator 606 may detect a difference between SUPPLY_OUT and 1.1 V, and output may be provided to a an inverter 608, which provides a CLK input to the D flip-flop 604. The D flip-flop 604 may detect only a rising edge at the CLK input when the SUPPLY_OUT drops below 1.1V. The falling edge at the CLK input is ignored when the SUPPLY_OUT is charged back up above 1.1V. This prevents TRANS_PROT_OUT from toggling between high (1.8V) and low (0V), which would cause SUPPLY_OUT to toggle between charging and discharging. As long as TRANS_PROT_OUT becomes high (1.8V), it remains high until a reset is completed.

When transitioning from the 1.8 V mode (or alternatively, the 1.2 V mode) to the 2.5 V mode, EN_SW1 may be set equal to 1 and EN_SW2 may be set equal to 0 (or alternatively, EN_SW3 may be set equal to 0) at the same time.

Figure 7:
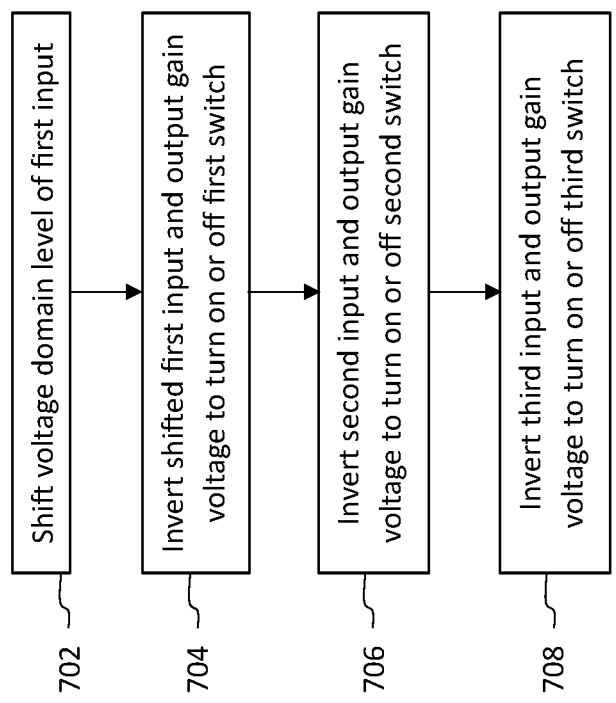
FIG. 7 is a flowchart illustrating a method for operating a digital control circuit of a switchable voltage supply circuit, according to an embodiment.

FIG. 7 is a flowchart illustrating a method of operating a digital control circuit of a switchable voltage supply circuit. At 702, a level shifter of the digital control circuit may shift a voltage domain level of a first input. At 704, a first inverter of the digital control circuit may invert output of the first level shifter to output a first gain voltage to turn on a first switch of the switchable voltage supply circuit or output a second gain voltage to turn off the first switch.

At 706, a second inverter of the digital control circuit may invert a second input to output a third gain voltage to turn on a second switch of the switchable voltage supply circuit or output a fourth gain voltage to turn off the second switch. The second input may enable the third gain voltage only when an output voltage from the switchable voltage supply circuit is less than a threshold voltage. At 708, a third inverter of the digital control circuit may invert a third input to output a fifth gain voltage to turn a third switch of the switchable voltage supply circuit or output a sixth gain voltage to turn off the third switch. The third input may enable the fifth gain voltage only when the output voltage from the switchable voltage supply circuit is less than the threshold voltage. Only one of the first, second, and third switches may be turned on at a given time.

Figure 8:
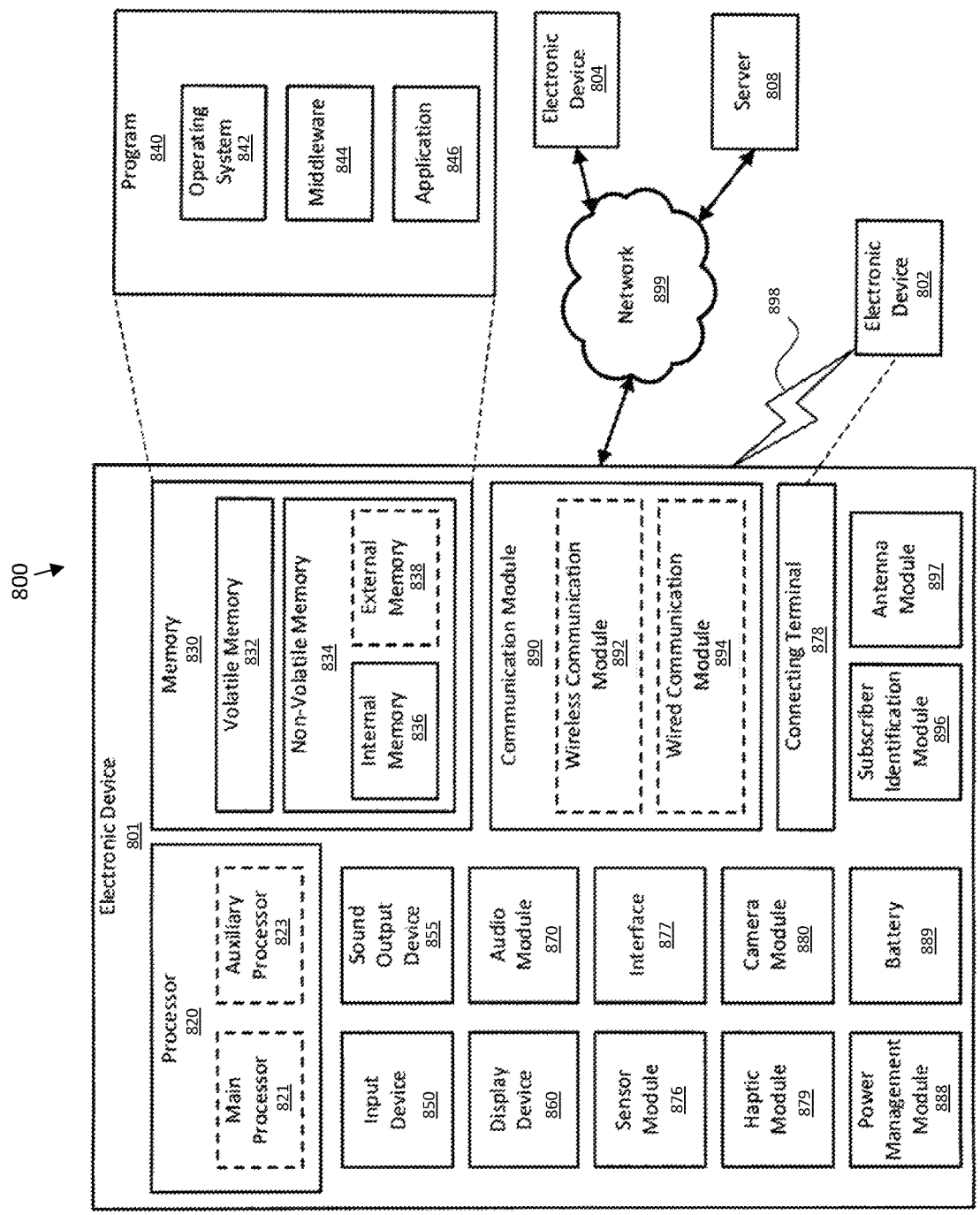
FIG. 8 is a block diagram of an electronic device in a network environment, according to an embodiment.

FIG. 8 is a block diagram of an electronic device in a network environment 800, according to an embodiment.

Referring to FIG. 8, an electronic device 801 in a network environment 800 may communicate with an electronic device 802 via a first network 898 (e.g., a short-range wireless communication network), or an electronic device 804 or a server 808 via a second network 899 (e.g., a long-range wireless communication network). The electronic device 801 may communicate with the electronic device 804 via the server 808. The electronic device 801 may include a processor 820, a memory 830, an input device 850, a sound output device 855, a display device 860, an audio module 870, a sensor module 876, an interface 877, a haptic module 879, a camera module 880, a power management module 888, a battery 889, a communication module 890, a subscriber identification module (SIM) card 896, or an antenna module 897. In one embodiment, at least one (e.g., the display device 860 or the camera module 880) of the components may be omitted from the electronic device 801, or one or more other components may be added to the electronic device 801. Some of the components may be implemented as a single integrated circuit (IC). For example, the sensor module 876 (e.g., a fingerprint sensor, an iris sensor, or an illuminance sensor) may be embedded in the display device 860 (e.g., a display).

The processor 820 may execute software (e.g., a program 840) to control at least one other component (e.g., a hardware or a software component) of the electronic device 801 coupled with the processor 820 and may perform various data processing or computations.

As at least part of the data processing or computations, the processor 820 may load a command or data received from another component (e.g., the sensor module 876 or the communication module 890) in volatile memory 832, process the command or the data stored in the volatile memory 832, and store resulting data in non-volatile memory 834. The processor 820 may include a main processor 821 (e.g., a central processing unit (CPU) or an application processor (AP)), and an auxiliary processor 823 (e.g., a graphics processing unit (GPU), an image signal processor (ISP), a sensor hub processor, or a communication processor (CP)) that is operable independently from, or in conjunction with, the main processor 821. Additionally or alternatively, the auxiliary processor 823 may be adapted to consume less power than the main processor 821, or execute a particular function. The auxiliary processor 823 may be implemented as being separate from, or a part of, the main processor 821.

The auxiliary processor 823 may control at least some of the functions or states related to at least one component (e.g., the display device 860, the sensor module 876, or the communication module 890) among the components of the electronic device 801, instead of the main processor 821 while the main processor 821 is in an inactive (e.g., sleep) state, or together with the main processor 821 while the main processor 821 is in an active state (e.g., executing an application). The auxiliary processor 823 (e.g., an image signal processor or a communication processor) may be implemented as part of another component (e.g., the camera module 880 or the communication module 890) functionally related to the auxiliary processor 823.

The memory 830 may store various data used by at least one component (e.g., the processor 820 or the sensor module 876) of the electronic device 801. The various data may include, for example, software (e.g., the program 840) and input data or output data for a command related thereto. The memory 830 may include the volatile memory 832 or the non-volatile memory 834. Non-volatile memory 834 may include internal memory 836 and/or external memory 838.

The program 840 may be stored in the memory 830 as software, and may include, for example, an operating system (OS) 842, middleware 844, or an application 846.

The input device 850 may receive a command or data to be used by another component (e.g., the processor 820) of the electronic device 801, from the outside (e.g., a user) of the electronic device 801. The input device 850 may include, for example, a microphone, a mouse, or a keyboard.

The sound output device 855 may output sound signals to the outside of the electronic device 801. The sound output device 855 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 860 may visually provide information to the outside (e.g., a user) of the electronic device 801. The display device 860 may include, for example, a display, a hologram device, or a projector and control circuitry to control a corresponding one of the display, hologram device, and projector. The display device 860 may include touch circuitry adapted to detect a touch, or sensor circuitry (e.g., a pressure sensor) adapted to measure the intensity of force incurred by the touch.

The audio module 870 may convert a sound into an electrical signal and vice versa. The audio module 870 may obtain the sound via the input device 850 or output the sound via the sound output device 855 or a headphone of an external electronic device 802 directly (e.g., wired) or wirelessly coupled with the electronic device 801.

The sensor module 876 may detect an operational state (e.g., power or temperature) of the electronic device 801 or an environmental state (e.g., a state of a user) external to the electronic device 801, and then generate an electrical signal or data value corresponding to the detected state. The sensor module 876 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 877 may support one or more specified protocols to be used for the electronic device 801 to be coupled with the external electronic device 802 directly (e.g., wired) or wirelessly. The interface 877 may include, for example, a high-definition multimedia interface (HDMI), a universal serial bus (USB) interface, a secure digital (SD) card interface, or an audio interface.

A connecting terminal 878 may include a connector via which the electronic device 801 may be physically connected with the external electronic device 802. The connecting terminal 878 may include, for example, an HDMI connector, a USB connector, an SD card connector, or an audio connector (e.g., a headphone connector).

The haptic module 879 may convert an electrical signal into a mechanical stimulus (e.g., a vibration or a movement) or an electrical stimulus which may be recognized by a user via tactile sensation or kinesthetic sensation. The haptic module 879 may include, for example, a motor, a piezoelectric element, or an electrical stimulator.

The camera module 880 may capture a still image or moving images. The camera module 880 may include one or more lenses, image sensors, image signal processors, or flashes. The power management module 888 may manage power supplied to the electronic device 801. The power management module 888 may be implemented as at least part of, for example, a power management integrated circuit (PMIC).

The battery 889 may supply power to at least one component of the electronic device 801. The battery 889 may include, for example, a primary cell which is not rechargeable, a secondary cell which is rechargeable, or a fuel cell.

The communication module 890 may support establishing a direct (e.g., wired) communication channel or a wireless communication channel between the electronic device 801 and the external electronic device (e.g., the electronic device 802, the electronic device 804, or the server 808) and performing communication via the established communication channel. The communication module 890 may include one or more communication processors that are operable independently from the processor 820 (e.g., the AP) and supports a direct (e.g., wired) communication or a wireless communication. The communication module 890 may include a wireless communication module 892 (e.g., a cellular communication module, a short-range wireless communication module, or a global navigation satellite system (GNSS) communication module) or a wired communication module 894 (e.g., a local area network (LAN) communication module or a power line communication (PLC) module). A corresponding one of these communication modules may communicate with the external electronic device via the first network 898 (e.g., a short-range communication network, such as BLUETOOTH™, wireless-fidelity (Wi-Fi) direct, or a standard of the Infrared Data Association (IrDA)) or the second network 899 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 892 may identify and authenticate the electronic device 801 in a communication network, such as the first network 898 or the second network 899, using subscriber information (e.g., international mobile subscriber identity (IMSI)) stored in the subscriber identification module 896.

The antenna module 897 may include an RF power amplifier that includes a switchable voltage supply circuit, as described above with respect to FIGS. 3-6. The antenna module 897 may transmit or receive a signal or power to or from the outside (e.g., the external electronic device) of the electronic device 801. The antenna module 897 may include one or more antennas, and, therefrom, at least one antenna appropriate for a communication scheme used in the communication network, such as the first network 898 or the second network 899, may be selected, for example, by the communication module 890 (e.g., the wireless communication module 892). The signal or the power may then be transmitted or received between the communication module 890 and the external electronic device via the selected at least one antenna.

Commands or data may be transmitted or received between the electronic device 801 and the external electronic device 804 via the server 808 coupled with the second network 899. Each of the electronic devices 802 and 804 may be a device of a same type as, or a different type, from the electronic device 801. All or some of operations to be executed at the electronic device 801 may be executed at one or more of the external electronic devices 802, 804, or 808. For example, if the electronic device 801 should perform a function or a service automatically, or in response to a request from a user or another device, the electronic device 801, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 801. The electronic device 801 may provide the outcome, with or without further processing of the outcome, as at least part of a reply to the request. To that end, a cloud computing, distributed computing, or client-server computing technology may be used, for example.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A digital control circuit of a switchable voltage supply circuit, the digital control circuit comprising:
   a first gain voltage path comprising at least a first level shifter and a first inverter, the first level shifter being configured to shift a voltage domain level of a first input, and the first inverter being configured to invert output of the first level shifter, and output a first gain voltage to turn on a first switch of the switchable voltage supply circuit or output a second gain voltage to turn off the first switch; and
   a second gain voltage path comprising at least a second inverter configured to receive a second input, wherein the second inverter is configured to output a third gain voltage to turn on a second switch of the switchable voltage supply circuit or output a fourth gain voltage to turn off the second switch,
   wherein the first inverter outputs the second gain voltage in case that the second inverter outputs the third gain voltage, the second inverter outputs the fourth gain voltage in case that the first inverter outputs the first gain voltage, and the first gain voltage is greater than the third gain voltage.

2. The digital control circuit of claim 1, wherein the first gain voltage path further comprises a voltage generator configured to provide a voltage to the first inverter, and the first inverter outputs the first gain voltage or the second gain voltage based on the voltage.

3. The digital control circuit of claim 1, wherein the first level shifter comprises a first resistor between a first transistor source node and a voltage supply for the second gain voltage, and a second resistor between a second transistor source node and the voltage supply for the second gain voltage.

4. The digital control circuit of claim 1, further comprising a first bulk voltage path comprising a second level shifter and a third inverter, the second level shifter being configured to shift a voltage domain level of the second input, and the third inverter being configured to invert output of the second level shifter, wherein the third inverter is configured to output a first bulk voltage to the second switch in case that the second inverter outputs the third gain voltage, and wherein the third inverter is configured output a second bulk voltage to the second switch in case that the second inverter outputs the fourth gain voltage.

5. The digital control circuit of claim 4, wherein the second gain voltage path and the first bulk voltage path further comprise a first transition protection circuit and a first AND gate, the first transition protection circuit being configured to compare an output voltage from the switchable voltage supply circuit to a threshold voltage, and the first AND gate being configured to output the second input based on a comparison at the first transition protection circuit.

6. The digital control circuit of claim 5, wherein the second input results in the third gain voltage turning on the second switch only in case that the output voltage from the switchable voltage supply circuit is less than the threshold voltage.

7. The digital control circuit of claim 1, further comprising a third gain voltage path comprising at least a fourth inverter configured to receive a third input, wherein the fourth inverter is configured to output a fifth gain voltage to turn on a third switch of the switchable voltage supply circuit or output a sixth gain voltage to turn off the third switch,
   wherein the first inverter outputs the second gain voltage and the second inverter outputs the fourth gain voltage in case that the fourth inverter outputs the fifth gain voltage, the fourth inverter outputs the sixth gain voltage in case that the first inverter outputs the first gain voltage or the second inverter outputs the third gain voltage, and the first gain voltage is greater than the fifth gain voltage.

8. The digital control circuit of claim 7, further comprising a second bulk voltage path comprising a third level shifter and a fifth inverter, the third level shifter being configured to shift a voltage domain level of the third input, and the fifth inverter being configured to invert output of the third level shifter, wherein the fifth inverter is configured to output a third bulk voltage to the third switch in case that the fourth inverter outputs the fifth gain voltage, and wherein the fifth inverter is configured output a fourth bulk voltage to the third switch in case that the fourth inverter outputs the sixth gain voltage.

9. The digital control circuit of claim 8, wherein the third gain voltage path and the second bulk voltage path further comprise a second transition protection circuit and a second AND gate, the second transition protection circuit being configured to compare an output voltage from the switchable voltage supply circuit to a threshold voltage, and the second AND gate being configured to output the third input based on a comparison at the second transition protection circuit.

10. The digital control circuit of claim 9, wherein the third input results in the fifth gain voltage turning on the third switch only in case that the output voltage from the switchable voltage supply circuit is less than the threshold voltage.

11. A switchable voltage supply circuit comprising:
    voltage supply switches, each of the voltage supply switches receiving a different source voltage; and
    a digital control circuit comprising:
      a first gain voltage path comprising at least a first level shifter and a first inverter, the first level shifter being configured to shift a voltage domain level of a first input, and the first inverter being configured to invert output of the first level shifter, and output a first gain voltage to turn on a first switch of the voltage supply switches or output a second gain voltage to turn off the first switch; and
      a second gain voltage path comprising at least a second inverter configured to receive a second input, wherein the second inverter is configured to output a third gain voltage to turn on a second switch of the voltage supply switches or output a fourth gain voltage to turn off the second switch,
      wherein the first inverter outputs the second gain voltage in case that the second inverter outputs the third gain voltage, the second inverter outputs the fourth gain voltage in case that the first inverter outputs the first gain voltage, and the first gain voltage is greater than the third gain voltage.

12. The switchable voltage supply circuit of claim 11, wherein the first gain voltage path further comprises a voltage generator configured to provide a voltage to the first inverter, and the first inverter outputs the first gain voltage or the second gain voltage based on the voltage.

13. The switchable voltage supply circuit of claim 11, wherein the first level shifter comprises a first resistor between a first transistor source node and a voltage supply for the second gain voltage, and a second resistor between a second transistor source node and the voltage supply for the second gain voltage.

14. The switchable voltage supply circuit of claim 11, wherein the digital control circuit further comprises a first bulk voltage path comprising a second level shifter and a third inverter, the second level shifter being configured to shift a voltage domain level of the second input, and the third inverter being configured to invert output of the second level shifter, wherein the third inverter is configured to output a first bulk voltage to the second switch in case that the second inverter outputs the third gain voltage, and wherein the third inverter is configured output a second bulk voltage to the second switch in case that the second inverter outputs the fourth gain voltage.

15. The switchable voltage supply circuit of claim 14, wherein the second gain voltage path and the first bulk voltage path further comprise a first transition protection circuit and a first AND gate, the first transition protection circuit being configured to compare an output voltage from the switchable voltage supply circuit to a threshold voltage, and the first AND gate being configured to output the second input based on a comparison at the first transition protection circuit.

16. The switchable voltage supply circuit of claim 15, wherein the second input results in the third gain voltage turning on the second switch only in case that the output voltage from the switchable voltage supply circuit is less than the threshold voltage.

17. The switchable voltage supply circuit of claim 11, wherein the digital control circuit further comprises a third gain voltage path comprising at least a fourth inverter configured to receive a third input, wherein the fourth inverter is configured to output a fifth gain voltage to turn on a third switch of the voltage supply switches or output a sixth gain voltage to turn off the third switch, wherein the first inverter outputs the second gain voltage and the second inverter outputs the fourth gain voltage in case that the fourth inverter outputs the fifth gain voltage, the fourth inverter outputs the sixth gain voltage in case that the first inverter outputs the first gain voltage or the second inverter outputs the third gain voltage, and the first gain voltage is greater than the fifth gain voltage.

18. The switchable voltage supply circuit of claim 17, wherein the digital control circuit further comprises a second bulk voltage path comprising a third level shifter and a fifth inverter, the third level shifter being configured to shift a voltage domain level of the third input, and the fifth inverter being configured to invert output of the third level shifter, wherein the fifth inverter is configured to output a third bulk voltage to the third switch in case that the fourth inverter outputs the fifth gain voltage, and wherein the fifth inverter is configured output a fourth bulk voltage to the third switch in case that the fourth inverter outputs the sixth gain voltage.

19. The voltage supply switching circuit of claim 18, wherein:

the third gain voltage path and the second bulk voltage path further comprise a second transition protection circuit and a second AND gate, the second transition protection circuit being configured to compare an output voltage from the switchable voltage supply circuit to a threshold voltage, and the second AND gate being configured to output the third input based on a comparison at the second transition protection circuit, and the third input results in the fifth gain voltage turning on the third switch only in case that the output voltage from the switchable voltage supply circuit is less than the threshold voltage.

20. A method comprising:

shifting a voltage domain level of a first input at a first level shifter of a digital control circuit for a switchable voltage supply circuit;

inverting, at a first inverter of the digital control circuit, output of the first level shifter to output a first gain voltage to turn on a first switch of the switchable voltage supply circuit or output a second gain voltage to turn off the first switch;

inverting, at a second inverter of the digital control circuit, a second input to output a third gain voltage to turn on a second switch of the switchable voltage supply circuit or output a fourth gain voltage to turn off the second switch, wherein the first inverter outputs the second gain voltage in case that the second inverter outputs the third gain voltage, the second inverter outputs the fourth gain voltage in case that the first inverter outputs the first gain voltage, and the first gain voltage is greater than the third gain voltage.

* * * * *